United States Patent
Tsai et al.

(10) Patent No.: US 9,847,312 B2
(45) Date of Patent: Dec. 19, 2017

(54) PACKAGE STRUCTURE

(71) Applicant: DELTA ELECTRONICS, INC., Taoyuan (TW)

(72) Inventors: Hsin-Chang Tsai, Taoyuan (TW); Peng-Hsin Lee, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 15/157,896

(22) Filed: May 18, 2016

(65) Prior Publication Data
US 2017/0092570 A1 Mar. 30, 2017

(30) Foreign Application Priority Data
Sep. 30, 2015 (TW) .............................. 104131998 A

(51) Int. Cl.
*H01L 29/15* (2006.01)
*H01L 23/00* (2006.01)
(Continued)

(52) U.S. Cl.
CPC .......... *H01L 24/33* (2013.01); *H01L 23/3107* (2013.01); *H01L 23/49524* (2013.01);
(Continued)

(58) Field of Classification Search
CPC ......... H01L 23/49541; H01L 23/49568; H01L 23/3675; H01L 24/33; H01L 23/3107;
(Continued)

(56) References Cited

U.S. PATENT DOCUMENTS

2002/0020907 A1 2/2002 Seo et al.
2006/0192295 A1* 8/2006 Lee .................. H01L 23/16
257/778
(Continued)

FOREIGN PATENT DOCUMENTS

TW 201306206 2/2013
TW 201312669 3/2013
(Continued)

*Primary Examiner* — Allen Parker
*Assistant Examiner* — Wasiul Haider
(74) *Attorney, Agent, or Firm* — Hauptman Ham, LLP

(57) ABSTRACT

A package structure includes an encapsulant, an active component, a first lead frame segment, and a second lead frame segment. The active component is encapsulated within the encapsulant and includes first and second electrodes. The first and second electrodes are respectively disposed on and electrically connected to the first and second lead frame segments. The first and second lead frame segments respectively have first and second exposed surfaces. The first exposed surface and the first electrode are respectively located on opposite sides of the first lead frame segment. The second exposed surface and the second electrode are respectively located on opposite sides of the second lead frame segment. The first and second exposed surfaces are exposed outside the encapsulant. A minimal distance from the first electrode to the second electrode is less than a minimal distance from the first exposed surface to the second exposed surface.

14 Claims, 6 Drawing Sheets

(51) Int. Cl.
    *H01L 23/31*      (2006.01)
    *H01L 23/495*     (2006.01)
(52) U.S. Cl.
    CPC .. *H01L 23/49548* (2013.01); *H01L 23/49562* (2013.01); *H01L 23/49568* (2013.01); *H01L 2224/32245* (2013.01); *H01L 2224/33181* (2013.01); *H01L 2924/1033* (2013.01); *H01L 2924/13055* (2013.01); *H01L 2924/13062* (2013.01); *H01L 2924/13091* (2013.01)
(58) Field of Classification Search
    CPC . H01L 2224/32245; H01L 2224/33181; H01L 2924/1033; H01L 2924/13091; H01L 2924/13062; H01L 2924/13055
    See application file for complete search history.

(56) References Cited

U.S. PATENT DOCUMENTS

| | | |
|---|---|---|
| 2011/0221047 A1 | 9/2011 | Yang et al. |
| 2015/0235932 A1* | 8/2015 | Fernando .......... H01L 23/49513 257/676 |
| 2016/0268185 A1* | 9/2016 | McKnight-MacNeil H01L 23/49562 |

FOREIGN PATENT DOCUMENTS

| | | |
|---|---|---|
| TW | 201320262 | 5/2013 |
| TW | 201330332 | 7/2013 |
| TW | 201403762 | 1/2014 |

* cited by examiner

PACKAGE STRUCTURE

RELATED APPLICATIONS

This application claims priority to Taiwan Application Serial Number 104131998, filed Sep. 30, 2015, which is herein incorporated by reference.

BACKGROUND

Technical Field

The present disclosure relates to a package structure.

Description of Related Art

With the development of information technology (IT), electronic devices have been scaled down in size. Therefore, device density over the circuit board has been increased, so that the issue of heat dissipation has become important.

In greater detail, a power transistor is commonly used in a power supply device, a control apparatus, an electric appliance, or computer peripheral equipment. The main function of the power transistor is signal processing or power driving. The power transistor typically processes high-power signals, and such processing generates considerable heat. Therefore, the need for heat dissipation is particularly important in this case.

In general, the heat of a power transistor may be dissipated by the design of a lead frame. In addition to the heat dissipation issue, since the signal power transferring through the power transistor is high, a short circuit may occur in the lead frame which is connected to different electrodes. Therefore, the design of the lead frame should be such that the prevention of short circuits is also realized. As a result, it is important to consider both heat dissipation and short circuit issues of a power transistor.

SUMMARY

In an aspect of the present disclosure, heat dissipation and short circuit issues are both considered.

In accordance with one embodiment of the present disclosure, a package structure includes an encapsulant, an active component, a lead frame structure including a first lead frame segment and a second lead frame segment. The active component is encapsulated within the encapsulant. The active component includes a first electrode and a second electrode. The first electrode is disposed on and electrically connected to the first lead frame segment. The first lead frame segment has a first exposed surface. The first exposed surface and the first electrode are respectively located on opposite sides of the first lead frame segment. The first exposed surface is exposed outside the encapsulant. The second electrode is disposed on and electrically connected to the second lead frame segment. The second lead frame segment has a second exposed surface. The second exposed surface and the second electrode are respectively located on opposite sides of the second lead frame segment. The second exposed surface is exposed outside the encapsulant. A minimal distance from the first electrode to the second electrode is less than a minimal distance from the first exposed surface to the second exposed surface.

In the foregoing embodiment, since the first and second lead frame segments respectively have first and second exposed surfaces exposed outside the encapsulant, the heat of the active component may be transferred out of the encapsulant. Moreover, since the minimal distance from the first exposed surface to the second exposed surface is greater than the minimal distance from the first electrode to the second electrode, the first exposed surface is not positioned excessively close to the second exposed surface. As a result, even if the first electrode and/or the second electrode of the active component transfers high power signals, which would ordinarily result in the formation of an electric arc, the sufficient distance between the first exposed surface and the second exposed surface is such that such a formation of an electric arc is prevented, ultimately preventing the first electrode and the second electrode from short circuits caused by an electric arc. Therefore, in the foregoing embodiment, heat dissipation and short circuit issues of the active component are both considered.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
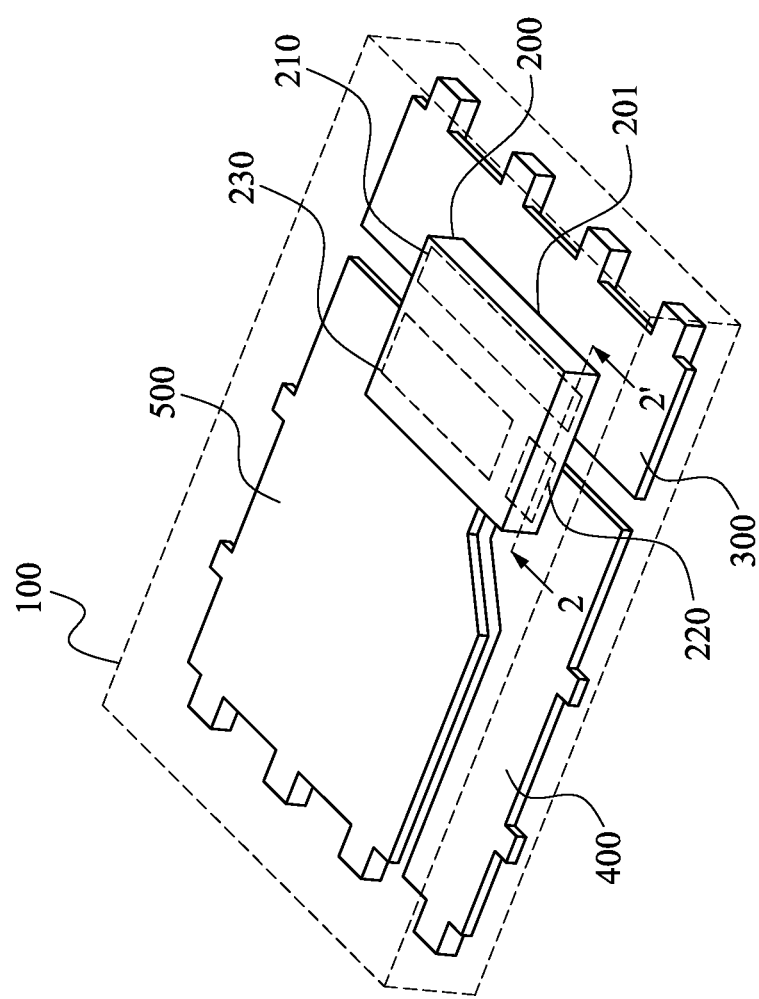
FIG. 1 is a schematic perspective view of a package structure in accordance with one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
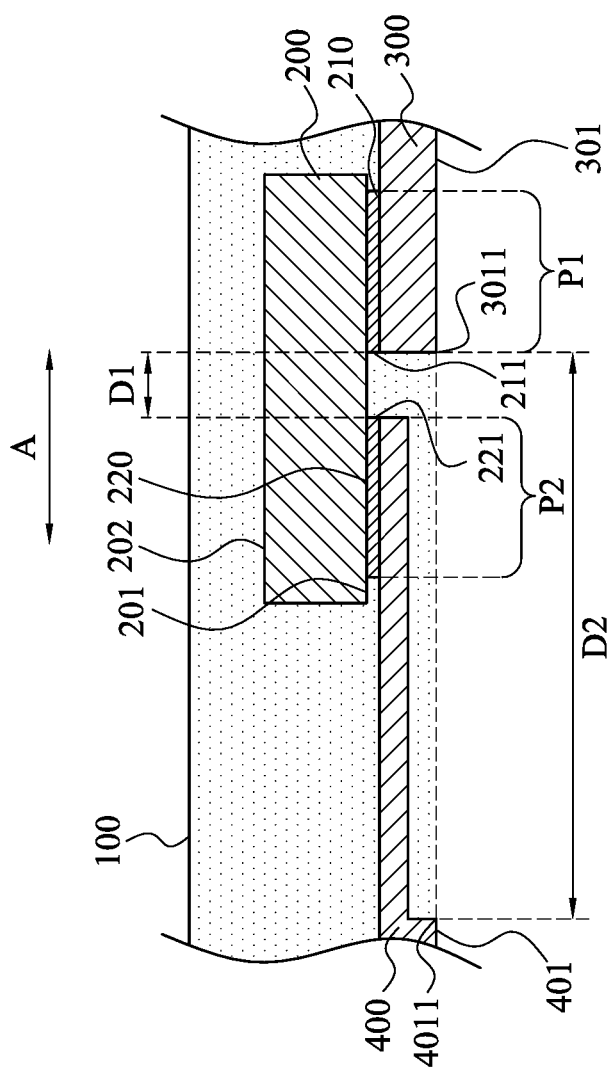
FIG. 2 is a schematic cross-sectional view taken along line 2-2' in FIG. 1.

FIG. 1 is a schematic perspective view of a package structure in accordance with one embodiment of the present disclosure. FIG. 2 is a schematic cross-sectional view taken along line 2-2' in FIG. 1. As shown in FIGS. 1 and 2, in this embodiment, the package structure includes an encapsulant 100, an active component 200, a lead frame structure including a first lead frame segment 300 and a second lead frame segment 400. The active component 200 is encapsulated within the encapsulant 100, so as to be protected by the encapsulant 100. The active component 200 includes a first electrode 210 and a second electrode 220. The first electrode 210 is disposed on and electrically connected to the first lead frame segment 300. The second electrode 220 is disposed on and electrically connected to the second lead frame segment 400. The first lead frame segment 300 has a first exposed surface 301. The first exposed surface 301 and the first electrode 210 are respectively located on opposite sides of the first lead frame segment 300. In other words, the first exposed surface 301 faces away from the first electrode 210. The second lead frame segment 400 has a second exposed surface 401. The second exposed surface 401 and the second electrode 220 are respectively located on opposite sides of the second lead frame segment 400. In other words, the second exposed surface 401 faces away from the second electrode 220. The first exposed surface 301 and the second exposed surface 401 are exposed outside the encapsulant 100. Therefore, when the active component 200 is in operation, the heat generated by the first electrode 210 may be transferred to the first exposed surface 301 through the first lead frame segment 300, thereby transferring the heat to an external environment, such as the air, through the first exposed surface 301. Similarly, the heat generated by the second electrode 220 may be transferred to the second exposed surface 401 through the second lead frame segment 400, thereby transferring the heat to an external environment, such as the air, through the second exposed surface 401. In some embodiments, the active component 200 includes a GaN layer. In other words, the active component 200 includes GaN therein.

As shown in FIG. 2, a minimal distance D1 is formed between the first electrode 210 and the second electrode 220. A minimal distance D2 is formed between the first exposed surface 301 and the second exposed surface 401. The minimal distance D1 is less than the minimal distance D2. Therefore, when the first electrode 210 and/or the second electrode 220 transfers high power signals, although which has the potential of the first and second exposed surfaces 301 and 302 causing the formation of an electric arc due to exposure to the outside the encapsulant 100, the minimal distance D2 is sufficient, so that the formation of an electric arc may be prevented, ultimately preventing the first electrode 210 and the second electrode 220 from short circuits. Therefore, in this embodiment, heat dissipation and short circuit issues are both considered.

In some embodiments, the active component 200 includes a first surface 201 and a second surface 202. The first surface 201 and the second surface 202 are opposite to each other. In other words, the first surface 201 and the second surface 202 are respectively located on opposite sides of the active component 200. In some embodiments, the second surface 202 is buried within the encapsulant 100. In some other embodiments, the second surface 202 may be exposed outside the encapsulant 100 to benefit heat dissipation. The first electrode 210 and the second electrode 220 are located on the first surface 201. In other words, the first electrode 210 and the second electrode 220 are located on the same surface of the active component 200. The first electrode 210 has a first inner edge 211 closest to the second electrode 220. The second electrode 220 has a second inner edge 221 closest to the first electrode 210. The first electrode 210 and the second electrode 220 are arranged on the first surface 201 along an arrangement direction A. The minimal distance D1 refers to a distance measured along the arrangement direction A from the first inner edge 211 to the second inner edge 221. The first exposed surface 301 has a first exposed edge 3011 closest to the second exposed surface 401. The second exposed surface 401 has a second exposed edge 4011 closest to the first exposed surface 301. The minimal distance D2 refers to a distance measured along the arrangement direction A from the first exposed edge 3011 to the second exposed edge 4011.

In some embodiments, as shown in FIG. 2, an orthogonal projection P1 of the first electrode 210 onto the first lead frame segment 300 overlaps the first exposed surface 301. In other words, as shown in FIG. 2, a portion of the first exposed surface 301 underlies the first electrode 210. Therefore, a heat transfer path from the first electrode 210 to the first exposed surface 301 can be shortened, such that heat of the first electrode 210 may be transferred to the first exposed surface 301 downwardly, thereby improving the heat dissipation ability that the first lead frame segment 300 contributes to the first electrode 210. For example, in some embodiments, as shown in FIG. 2, the orthogonal projection P1 of the first electrode 210 onto the first lead frame segment 300 may completely overlap the first exposed surface 301. In other words, the orthogonal projection P1 of the first electrode 210 onto the first lead frame segment 300 may be completely located within the first exposed surface 301. Therefore, the entire first electrode 210 overlies the first exposed surface 301, so that heat generated from any location of the first electrode 210 may be transferred to the first exposed surface 301 downwardly, thereby improving the heat dissipation ability that the first lead frame segment 300 contributes to the first electrode 210.

In some embodiments, as shown in FIG. 2, an orthogonal projection P2 of the second electrode 220 onto the second lead frame segment 400 does not overlap the second exposed surface 401. Such a design may keep the minimal distance D2 greater than the minimal distance D1 when the orthogonal projection P1 of the first electrode 210 onto the first lead frame segment 300 overlaps the first exposed surface 301, thereby preventing short circuiting of the first electrode 210 and the second electrode 220 due to the formation of an electric arc caused by the first and second lead frame segments 300 and 400. Besides, in some embodiments (not shown), the first lead frame segment 300 may be integrally formed with the second lead frame segment 400.

In some embodiments, since the orthogonal projection P2 of the second electrode 220 onto the second lead frame segment 400 does not overlap the second exposed surface 401, and the orthogonal projection P1 of the first electrode 210 onto the first lead frame segment 300 overlaps the first exposed surface 301, the heat dissipation ability that the second lead frame segment 400 contributes to the second electrode 220 may be lower than the heat dissipation ability that the first lead frame segment 300 contributes to the first electrode 210. Therefore, in some embodiments, a relatively hot electrode of the active component 200 may serve as the first electrode 210, and a relatively cold electrode may serve as the second electrode 220. For example, the active component 200 may be a metal-oxide semiconductor field effect transistor (MOSFET). When the MOSFET is in operation, the drain electrode has a higher temperature than the source electrode. Therefore, the first electrode 210 may be the drain electrode, and the second electrode 220 may be the source electrode, and as a result, the relatively hot drain electrode may be disposed on the first lead frame segment 300 having the relatively high heat dissipation ability, and the relatively cold source electrode may be disposed on the second lead frame segment 400 having the relatively low heat dissipation ability. It is understood that the MOSFET is only exemplary, and does not limit the active component 200 of the present disclosure. In some other embodiments, the active component 200 may be another device, such as, for example, a junction field effect transistor (JFET), a fin field effect transistor (FinFET), an insulated-gate bipolar transistor (IGBT), or the like.

In some embodiments, as shown in FIG. 1, the lead frame structure further includes a third lead frame segment 500, and the active component 200 further includes a third electrode 230. The third electrode 230 is located on the first surface 201 of the active component 200. In other words, the first, second, and third electrodes 210, 220 and 230 may be located on the same surface (namely, the first surface 201). The third electrode 230 is disposed on and electrically connected to the third lead frame segment 500. Therefore, the third electrode 230 is able to dissipate heat and transfer signals through the third lead frame segment 500. For example, the active component 200 may be a transistor, and the first electrode 210 may be a drain electrode of the transistor, the second electrode 220 may be a source electrode of the transistor, and the third electrode 230 may be a gate electrode of the transistor.

In some embodiments, the first lead frame segment 300, the second lead frame segment 400 and the third lead frame segment 500 may be made of a conductive material, so as to electrically connect corresponding electrodes. For example, the conductive material may be metal, but is not limited thereto. The first lead frame segment 300, the second lead frame segment 400 and the third lead frame segment 500 are spaced apart from each other, so as to prevent electrical connection therebetween and thereamong. For example, a portion of the encapsulant 100 may be filled in the gaps among the first lead frame segment 300, the second lead frame segment 400 and the third lead frame segment 500, so as to space them apart. In some embodiments, the material of the encapsulant 100 may be insulation glue, such as macromolecular glue, but is not limited thereto. This insulation glue may prevent electrical connection between and among the first, second, and third lead frame segments 300, 400 and 500. Besides, in some embodiments (not shown), at least two of the first lead frame segment 300, the second lead frame segment 400, and the third lead frame segment 500 are integrally formed with each other.

In some embodiments, a conductive glue (not shown) may be present between the first electrode 210 and the first lead frame segment 300, and therefore, the first electrode 210 can be fixed and electrically connected to the first lead frame segment 300. Similarly, in some embodiments, a conductive glue can be present between the second electrode 220 and the second lead frame segment 400, so that the second electrode 220 can be fixed and electrically connected to the second lead frame segment 400. Similarly, in some embodiments, a conductive glue can be present between the third electrode 230 and the third lead frame segment 500, so that the third electrode 230 can be fixed and electrically connected to the third lead frame segment 500. It is understood that the foregoing conductive glue is only exemplary to illustrate the connection of the electrode and the lead frame segment, and does not limit the present disclosure. In some other embodiments, the electrode and the lead frame segment can be connected by different means, such as connecting the electrode and the lead frame segment by soldering.

Figure 3:
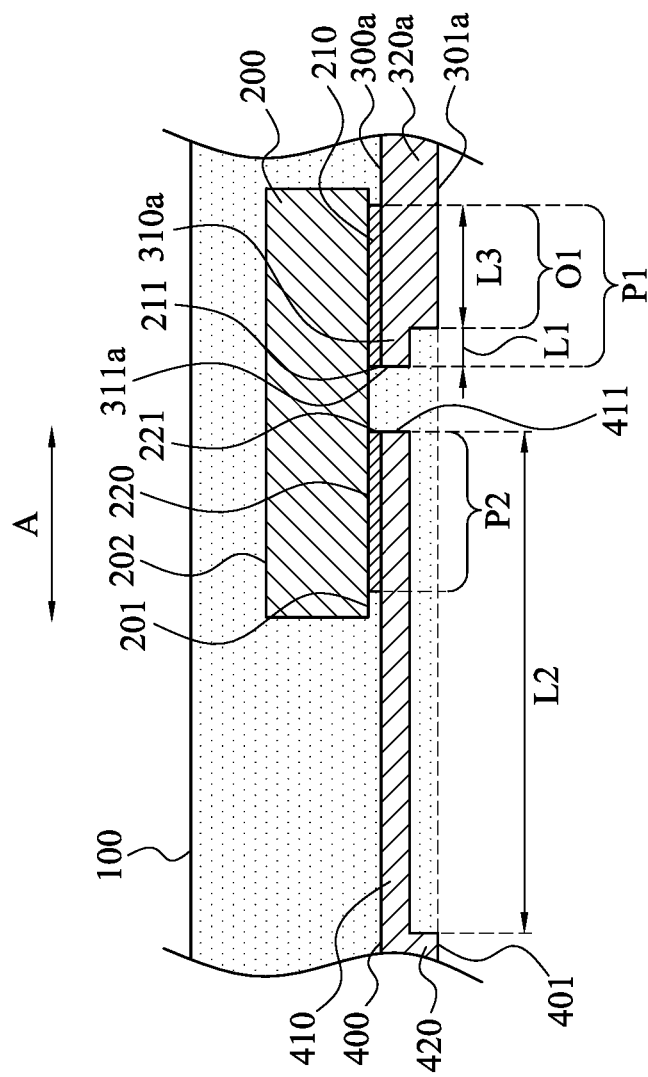
FIG. 3 is schematic cross-sectional view of a package structure in accordance with another embodiment of the present disclosure.

FIG. 3 is a schematic cross-sectional view of a package structure in accordance with another embodiment of the present disclosure. As shown in FIG. 3, the main difference between this embodiment and FIG. 2 is that the first lead frame segment 300a is different from the foregoing first lead frame segment 300. In particular, the first lead frame segment 300a includes a first embedded portion 310a and a first exposed portion 320a. The first embedded portion 310a and the first exposed portion 320a are arranged along the arrangement direction A of the first electrode 210 and the second electrode 220. The first embedded portion 310a is closer to the second electrode 220 than the first exposed portion 320a is. The first embedded portion 310a is embedded within the encapsulant 100 and is not exposed outside the encapsulant 100. The first exposed surface 301a is located on the first exposed portion 320a and exposed outside the encapsulant 100.

The first electrode 210 is disposed on the first embedded portion 310a and the first exposed portion 320a. In other words, the orthogonal projection P1 of the first electrode 210 onto the first lead frame segment 300a overlaps the first embedded portion 310a and the first exposed portion 320a. Stated in yet another manner, the orthogonal projection P1 of the first electrode 210 onto the first lead frame segment 300a is not completely located within the first exposed surface 301a. Since the orthogonal projection P1 of the first electrode 210 onto the first lead frame segment 300a overlaps the first embedded portion 310a, and the first embedded portion 310a is embedded within the encapsulant 100, the orthogonal projection P1 of the first electrode 210 onto the first lead frame segment 300a overlaps a portion of the encapsulant 100. In other words, this portion of the encapsulant 100 underlies the first electrode 210. More particularly, the first embedded portion 310a is located between this portion of the encapsulant 100 and the first electrode 210. Such a design is such that the encapsulant 100 more stably fixes or secures the first lead frame segment 300a.

In some embodiments, as shown in FIG. 3, the second lead frame segment 400 includes a second embedded portion 410 and a second exposed portion 420. The second embedded portion 410 and the second exposed portion 420 are arranged along the arrangement direction A of the first electrode 210 and the second electrode 220. The second embedded portion 410 is closer to the first electrode 210 than the second exposed portion 420 is. The second embedded portion 410 is embedded within the encapsulant 100 and is not exposed outside the encapsulant 100. The second exposed surface 401 is located on the second exposed portion 420 and exposed outside the encapsulant 100. The second electrode 220 is disposed on the second embedded portion 410. In other words, the orthogonal projection P2 of the second electrode 220 onto the second lead frame segment 400 overlaps the second embedded portion 410 and does not overlap the second exposed portion 420. Therefore, the second electrode 220 is completely disposed on the second embedded portion 410. Since the second embedded portion 410 is embedded within the encapsulant 100, the orthogonal projection P2 of the second electrode 220 onto the second lead frame segment 400 overlaps a portion of the encapsulant 100. In other words, this portion of the encapsulant 100 underlies the second electrode 220. More particularly, the second embedded portion 410 is located between this portion of the encapsulant 100 and the second electrode 220. Such a design is such that the encapsulant 100 more stably fixes or secures the second lead frame segment 400.

In some embodiments, as shown in FIG. 3, the first embedded portion 310a has a first embedded length L1 parallel to the arrangement direction A of the first electrode 210 and the second electrode 220. The second embedded portion 410 has a second embedded length L2 also parallel to the arrangement direction A. The first embedded length L1 is smaller than the second embedded length L2. In other words, along a dimension parallel to the arrangement direction A, the first embedded portion 310a is shorter than the second embedded portion 410. This may benefit the minimal distance from the first exposed surface 301a to the first inner edge 211 along the arrangement direction A less than the minimal distance from the second exposed surface 401 to the second inner edge 221 along the arrangement direction A, so that the heat dissipation ability of the first lead frame segment 300a may be higher than that of the second lead frame segment 400. Therefore, the drain electrode, tends to generate a relatively large amount of heat, may be disposed on the first lead frame segment 300a, and the source electrode, which tends to generate a relatively small amount of heat, may be disposed on the second lead frame segment 400.

For example, the first embedded portion 310a has an inner end surface 311a closest to the second embedded portion 410, and the second embedded portion 410 has an inner end surface 411 closest to the first embedded portion 310a. In some embodiments, the inner end surface 311a may be substantially aligned with the first inner edge 211 of the first electrode 210, so that the minimal distance from the first exposed surface 301a to the first inner edge 211 along the arrangement direction A is the first embedded length L1 of the first embedded portion 310a. Similarly, in some embodiments, the inner end surface 411 of the second embedded portion 410 may be substantially aligned with the second inner edge 221 of the second electrode 220, so that the minimal distance from the second exposed surface 401 to the second inner edge 221 along the arrangement direction A is the second embedded length L2 of the second embedded portion 410. Since the first embedded length L1 is smaller than the second embedded length L2, the minimal distance from the first exposed surface 301a to the first inner edge 211 along the arrangement direction A is less than the minimal distance from the second exposed surface 401 to the second inner edge 221, so that the first lead frame segment 300a has a higher heat dissipation than the second lead frame segment 400.

In some embodiments, as shown in FIG. 3, the orthogonal projection P1 of the first electrode 210 onto the first lead frame segment 300a defines a first overlapping zone O1 with the first exposed surface 301a. The first overlapping zone O1 has a first overlapping length L3 parallel to the arrangement direction A of the first and second electrodes 210 and 220. Preferably, a ratio of the first embedded length L1 to the first overlapping length L3 is 1 to 3 (or greater), so as to improve the heat dissipation ability that the first lead frame segment 300a contributes to the first electrode 210. Besides, in some embodiments (not shown), the first lead frame segment 300a may be integrally formed with the second lead frame segment 400.

Other features shown in FIG. 3 are similar to those shown in FIGS. 1 and 2 and described above, and therefore, a description of such features will not be repeated.

Figure 4:
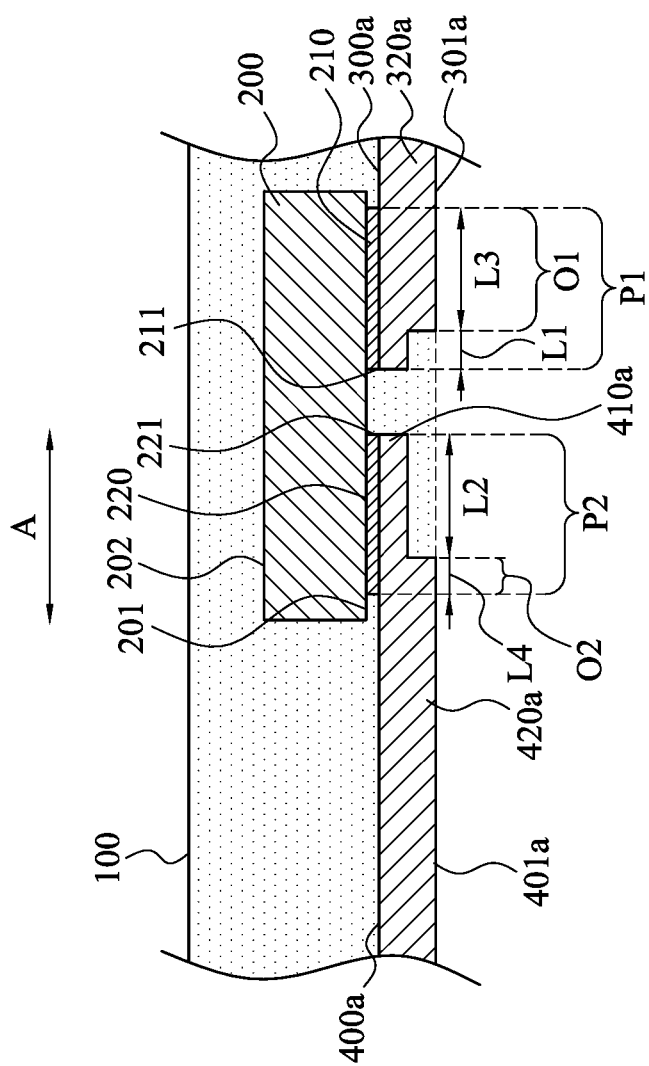
FIG. 4 is schematic cross-sectional view of a package structure in accordance with another embodiment of the present disclosure.

FIG. 4 is schematic cross-sectional view of a package structure in accordance with another embodiment of the present disclosure. As shown in FIG. 4, the main difference between this embodiment and FIG. 3 is that the orthogonal projection P2 of the second electrode 220 onto the second lead frame segment 400a overlaps the second exposed surface 401a. In other words, a portion of the second exposed surface 401a underlies the second electrode 220. As a result of this configuration, a heat transfer path from the second electrode 220 to the second exposed surface 401a can be shortened, so that the heat of the second electrode 220 may be transferred to the second exposed surface 401a downwardly, thereby improving the heat dissipation ability that the second lead frame segment 400a contributes to the second electrode 220. In particular, the second electrode 220 is disposed on the second embedded portion 410a and the second exposed portion 420a. In other words, the orthogonal projection of the second electrode 220 onto the second lead frame segment 400a not only overlaps the second embedded portion 410a, but also overlaps the second exposed surface 401a of the second exposed portion 420a, so as to benefit heat dissipation.

In some embodiments, as shown in FIG. 4, the orthogonal projection P2 of the second electrode 220 onto the second lead frame segment 400a defines a second overlapping zone O2 with the second exposed surface 401a. The second overlapping zone O2 has a second overlapping length L4 parallel to the arrangement direction A of the first and second electrodes 210 and 220. The first overlapping length L3 of the first overlapping zone O1 is greater than the second overlapping length L4 of the second overlapping zone O2. In other words, the overlapping area of the first exposed surface 301a and the first electrode 210 is greater than the overlapping area of the second exposed surface 401a and the second electrode 220, so that the heat dissipation ability that the first lead frame segment 300a contributes to the first electrode 210 is higher than the heat dissipation ability that the second lead frame segment 400a contributes to the second electrode 220. Besides, in some embodiments, the first lead frame segment 300a may be integrally formed with the second lead frame segment 400a.

Other features shown in FIG. 4 are similar to those shown in FIGS. 1-3 and described above, and therefore, a description of such features will not be repeated.

Figure 5:
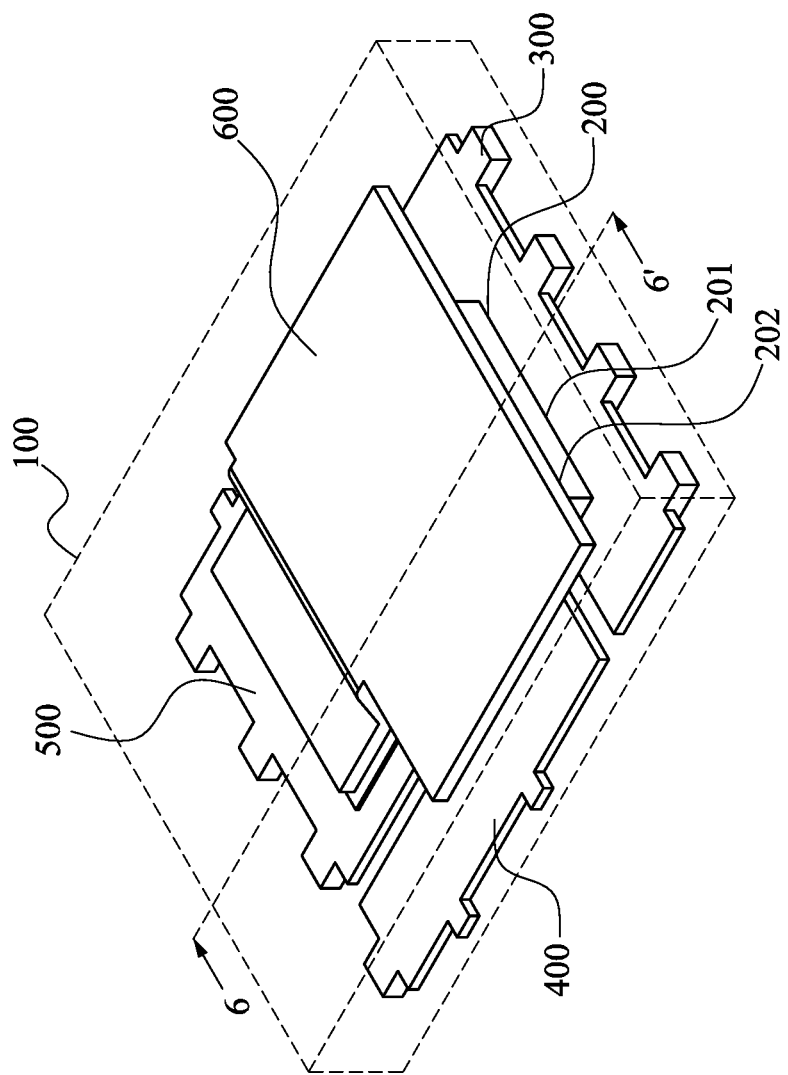
FIG. 5 is schematic perspective view of a package structure in accordance with another embodiment of the present disclosure.
Figure 6:
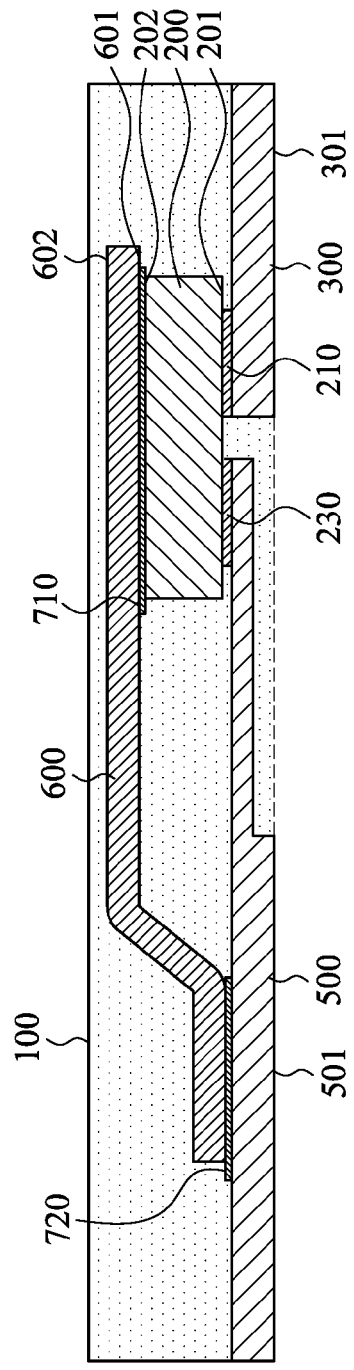
FIG. 6 is a schematic cross-sectional view taken along line 6-6' in FIG. 5.

FIG. 5 is schematic perspective view of a package structure in accordance with another embodiment of the present disclosure. FIG. 6 is a schematic cross-sectional view taken along line 6-6' in FIG. 5. As shown in FIGS. 5 and 6, the main difference between this embodiment and the foregoing embodiments is that the package structure further includes a heat dissipation member 600. The heat dissipation member 600 connects the second surface 202 of the active component 200 and the third lead frame segment 500. Therefore, the heat of the active component 200 may not only be transferred to the first and second lead frame segments 300 and 400 through the first and second electrodes 210 and 220, but it may also be transferred to the third lead frame segment 500 through the heat dissipation member 600. In some embodiments, the heat dissipation member 600 may connect the second surface 202 of the active component 200 and the first lead frame segment 300, so that the heat of the active component 200 can be transferred to the first lead frame segment 300 through the second surface 202 and the heat dissipation member 600. In some other embodiments, the heat dissipation member 600 may connect the second surface 202 of the active component 200 and the second lead frame segment 400, so that the heat of the active component 200 can be transferred to the second lead frame segment 400 through the second surface 202 and the heat dissipation member 600. In other words, the heat dissipation member 600 may connect the second surface 202 of the active component 200 and at least one of the first lead frame segment 300, the second lead frame segment 400 and the third lead frame segment 500.

More particularly, as shown in FIG. 6, the heat dissipation member 600 includes a first heat conductive surface 601 and a second heat conductive surface 602 opposite to each other. The first heat conductive surface 601 faces toward the active component 200 and the third lead frame segment 500. The first heat conductive surface 601 is disposed on the active component 200 and the third lead frame segment 500. For example, the package structure may further include adhesive layers 710 and 720. The adhesive layer 710 is adhered between the first heat conductive surface 601 and the second surface 202 of the active component 200, and the adhesive layer 720 is adhesive between the first heat conductive surface 601 and the third lead frame segment 500. Therefore, the heat on the second surface 202 of the active component 200 may be transferred to the third lead frame segment 500 through the heat dissipation member 600. In some embodiments, the third lead frame segment 500 has a third exposed surface 501. The third exposed surface 501 is exposed outside the encapsulant 100. As a result, the heat transferred from the active component 200 to the third lead frame segment 500 may be dissipated to the external environment, such as the air, through the third exposed surface 501.

Other features shown in FIGS. 5 and 6 are similar to those shown in FIGS. 1-4 and described above, and therefore, a description of such features will not be repeated.

Figure 7:
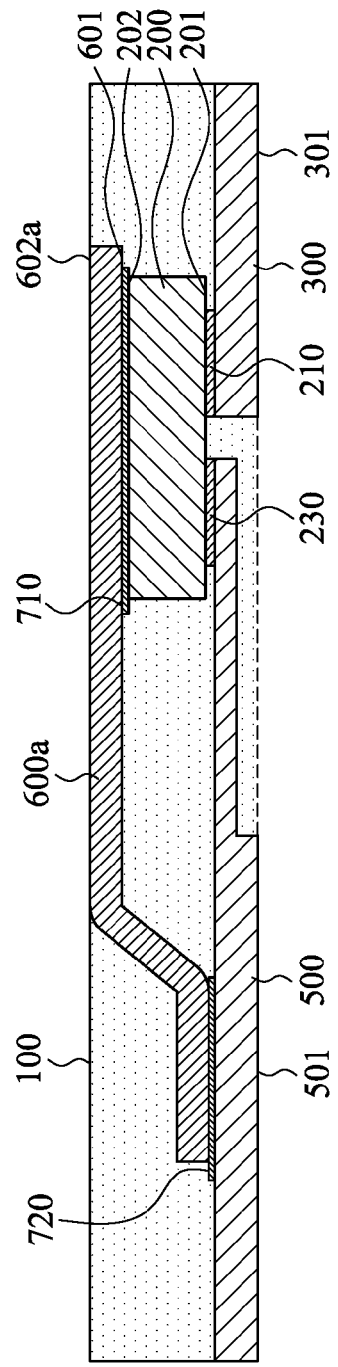
FIG. 7 is schematic cross-sectional view of a package structure in accordance with another embodiment of the present disclosure.

FIG. 7 is schematic cross-sectional view of a package structure in accordance with another embodiment of the present disclosure. As shown in FIG. 7, the main difference between this embodiment and the embodiment shown in FIG. 6 is that the second heat conductive surface 602a of the heat dissipation member 600a is exposed outside the encapsulant 100. Therefore, the heat transferred from the active component 200 to the heat dissipation member 600a may be not only transferred to the third lead frame segment 500 but also transferred to the external environment, such as the air, through the second heat conductive surface 602a. Other features shown in FIG. 7 are similar to those shown in FIGS. 1-6 and described above, and therefore, a description of such features will not be repeated.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A package structure, comprising:
    an encapsulant;
    an active component encapsulated within the encapsulant, the active component comprising a first electrode and a second electrode;
    a lead frame structure comprising a first lead frame segment and a second lead frame segment,
    wherein the first electrode is disposed on and electrically connected to the first lead frame segment, wherein the first lead frame segment has a first exposed surface, wherein the first exposed surface and the first electrode are respectively located on opposite sides of the first lead frame segment, and wherein the first exposed surface is exposed outside the encapsulant, wherein the second electrode is disposed on and electrically connected to the second lead frame segment, wherein the second lead frame segment has a second exposed surface, wherein the second exposed surface and the second electrode are respectively located on opposite sides of the second lead frame segment, and wherein the second exposed surface is exposed outside the encapsulant,
    wherein a minimal distance from the first electrode to the second electrode is less than a minimal distance from the first exposed surface to the second exposed surface, and
    wherein the first lead frame segment comprises a first embedded portion and a first exposed portion, wherein the first electrode and the second electrode are arranged along an arrangement direction, wherein the first embedded portion and the first exposed portion are arranged along the arrangement direction, wherein the first embedded portion is closer to the second electrode than the first exposed portion is, wherein an orthogonal projection of the first electrode onto the first lead frame segment overlaps the first embedded portion and the first exposed portion, wherein the first embedded portion is embedded within the encapsulant, and wherein the first exposed surface is located on the first exposed portion.

2. The package structure of claim 1, wherein an orthogonal projection of the second electrode onto the second lead frame segment does not overlap the second exposed surface.

3. The package structure of claim 1, wherein the orthogonal projection of the first electrode onto the first lead frame segment defines a first overlapping zone with the first exposed surface, and an orthogonal projection of the second electrode onto the second lead frame segment defines a second overlapping zone with the second exposed surface, wherein the first overlapping zone has a first overlapping length parallel to the arrangement direction, and the second overlapping zone has a second overlapping length parallel to the arrangement direction, and wherein the first overlapping length is greater than the second overlapping length.

4. The package structure of claim 1, wherein the first electrode has a first inner edge closest to the second electrode, and the second electrode has a second inner edge closest to the first electrode, and wherein a minimal distance from the first exposed surface to the first inner edge is less than a minimal distance from the second exposed surface to the second inner edge.

5. The package structure of claim 1, wherein the second lead frame segment comprises a second embedded portion and a second exposed portion, wherein the second embedded portion and the second exposed portion are arranged along the arrangement direction, wherein the second embedded portion is closer to the first electrode than the second exposed portion is, wherein an orthogonal portion of the second electrode onto the second lead frame segment overlaps the second embedded portion, wherein the second embedded portion is embedded within the encapsulant, wherein the second exposed surface is located on the second exposed portion, wherein the first embedded portion has a first embedded length parallel to the arrangement direction, wherein the second embedded portion has a second embedded length parallel to the arrangement direction, and wherein the first embedded length is smaller than the second embedded length.

6. The package structure of claim 1, wherein the first electrode is a drain electrode, and the second electrode is a source electrode.

7. The package structure of claim 1, further comprising a heat dissipation member, wherein the lead frame structure further comprises a third lead frame segment, wherein the active component has a first surface and a second surface and further comprises a third electrode, wherein the first surface and the second surface are opposite to each other, wherein the first electrode, the second electrode, and the third electrode are located on the first surface, wherein the third electrode is disposed on the third lead frame segment, and wherein the heat dissipation member connects the second surface of the active component and at least one of the first lead frame segment, the second lead frame segment, and the third lead frame segment.

8. The package structure of claim 7, wherein the heat dissipation member has a first heat conductive surface and a second heat conductive surface opposite to each other, wherein the first heat conductive surface faces toward the active component, and wherein the second heat conductive surface is exposed outside the encapsulant.

9. The package structure of claim 1, wherein the lead frame structure further comprises a third lead frame segment, wherein the active component has a first surface and a second surface and further comprises a third electrode, wherein the first surface and the second surface are opposite to each other, wherein the first electrode, the second electrode, and the third electrode are located on the first surface, and wherein the third electrode is disposed on the third lead frame segment.

10. The package structure of claim 9, further comprising a heat dissipation member, wherein the heat dissipation member connects the second surface of the active component and at least one of the first lead frame segment, the second lead frame segment, and the third lead frame segment.

11. The package structure of claim 10, wherein the heat dissipation member has a first heat conductive surface and a second heat conductive surface opposite to each other, wherein the first heat conductive surface faces toward the active component, and wherein the second heat conductive surface is exposed outside the encapsulant.

12. The package structure of claim 1, further comprising a heat dissipation member, wherein the heat dissipation member connects the active component and is exposed outside the encapsulant.

13. The package structure of claim 1, wherein the active component has a first surface and a second surface opposite to the first surface, wherein the first electrode and the second electrode of the active component are disposed on the first surface, and the second surface of the active component is exposed outside the encapsulant.

14. The packaging structure of claim 1, wherein the active component comprises a GaN layer.

* * * * *